United States Patent
Wang et al.

(10) Patent No.: US 11,604,387 B2
(45) Date of Patent: Mar. 14, 2023

(54) PIXEL STRUCTURE

(71) Applicant: Au Optronics Corporation, Hsinchu (TW)

(72) Inventors: Yi-Chu Wang, Hsinchu (TW); Cheng-Wei Lai, Hsinchu (TW); Fu-Chun Tsao, Hsinchu (TW); Hsiao-Tung Lin, Hsinchu (TW); Wei-Cheng Cheng, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 150 days.

(21) Appl. No.: 16/996,921

(22) Filed: Aug. 19, 2020

(65) Prior Publication Data

US 2021/0255510 A1  Aug. 19, 2021

(30) Foreign Application Priority Data

Feb. 18, 2020 (TW) ................. 109105178

(51) Int. Cl.

| G02F 1/1339 | (2006.01) |
| G02F 1/1343 | (2006.01) |
| G02F 1/1362 | (2006.01) |
| G02F 1/1368 | (2006.01) |
| H01L 27/12 | (2006.01) |

(52) U.S. Cl.
CPC ...... *G02F 1/134309* (2013.01); *G02F 1/1368* (2013.01); *G02F 1/13624* (2013.01); *G02F 1/136286* (2013.01); *H01L 27/124* (2013.01); *G02F 1/134345* (2021.01); *G02F 1/136227* (2013.01); *G02F 2201/122* (2013.01); *G02F 2201/123* (2013.01)

(58) Field of Classification Search
CPC ......... G02F 1/134309; G02F 1/136286; G02F 1/1368; G02F 1/136227; G02F 2201/122; G02F 2201/123; H01L 27/124
See application file for complete search history.

(56) References Cited

U.S. PATENT DOCUMENTS

| 8,330,921 B2 | 12/2012 | Tsao et al. |
| 9,529,231 B2 | 12/2016 | Kwon et al. |
| 10,055,058 B2 | 8/2018 | Kimura et al. |
| 10,095,072 B2 | 10/2018 | Cheng et al. |
| 2009/0190080 A1 | 7/2009 | Dessaud |

(Continued)

FOREIGN PATENT DOCUMENTS

| CN | 2735382 | 10/2005 |
| CN | 104423106 | 3/2015 |

(Continued)

*Primary Examiner* — James A Dudek
(74) *Attorney, Agent, or Firm* — JCIPRNET

(57) ABSTRACT

A pixel structure includes a data line, a scan line, a common signal line, a first switching element, a second switching element, a first pixel electrode, and a second pixel electrode. The first switching element is electrically connected to the scan line and the data line. The second switching element is electrically connected to the scan line and the common signal line. The first pixel electrode is electrically connected to the first switching element. The second pixel electrode is electrically connected to the second switching element. The second pixel electrode surrounds the first pixel electrode.

13 Claims, 9 Drawing Sheets

(56) References Cited

U.S. PATENT DOCUMENTS

| | | | |
|---|---|---|---|
| 2009/0207328 A1* | 8/2009 | Hur | G02F 1/133707 |
| | | | 349/48 |
| 2011/0149223 A1 | 6/2011 | Tsao et al. | |
| 2012/0162559 A1 | 6/2012 | Kim et al. | |
| 2015/0055040 A1 | 2/2015 | Kwon et al. | |
| 2015/0116620 A1* | 4/2015 | Song | G02F 1/134309 |
| | | | 349/43 |
| 2015/0268517 A1* | 9/2015 | Song | G02F 1/13624 |
| | | | 349/139 |
| 2015/0277192 A1 | 10/2015 | Park et al. | |
| 2016/0364082 A1 | 12/2016 | Kimura et al. | |
| 2019/0384131 A1 | 12/2019 | Liu | |

FOREIGN PATENT DOCUMENTS

| CN | 106062618 | 10/2016 |
|---|---|---|
| CN | 107329334 | 11/2017 |
| CN | 107589602 | 1/2018 |
| TW | 200933268 | 8/2009 |
| TW | 201122685 | 7/2011 |

\* cited by examiner

PIXEL STRUCTURE

CROSS-REFERENCE TO RELATED APPLICATION

This application claims the priority benefit of Taiwan patent application serial no. 109105178, filed on Feb. 18, 2020. The entirety of the above-mentioned patent application is hereby incorporated by reference here and made a part of this specification.

BACKGROUND

Technical Field

The disclosure relates to a pixel structure, and in particular, to a pixel structure including a first pixel electrode and a second pixel electrode.

Description of Related Art

In a liquid crystal display device with a single alignment direction, a phase delay varies greatly for light corresponding to different viewing angles. Therefore, a user of the liquid crystal display device is likely to perceive different screen brightness at different positions. Currently, a multi-domain vertical alignment technology is used for relieving this problem. In the multi-domain vertical alignment technology, a single pixel is divided into a plurality of domains, and liquid crystals in different domains may have different rotation directions, thereby relieving different phase delays of light emitted by the liquid crystal display device at different viewing angles.

However, as the technology advances, a liquid crystal display device has increasing resolution, and a single pixel has smaller size accordingly. Therefore, dividing a pixel into a plurality of domains while maintaining an aperture ratio is increasingly difficult.

SUMMARY

The invention provides a pixel structure that may be divided into a plurality of domains and has a high aperture ratio.

At least one embodiment of the invention provides a pixel structure. The pixel structure includes a data line, a scan line, a common signal line, a first switching element, a second switching element, a first pixel electrode, and a second pixel electrode. The first switching element is electrically connected to the scan line and the data line. The second switching element is electrically connected to the scan line and the common signal line. The first pixel electrode is electrically connected to the first switching element. The second pixel electrode is electrically connected to the second switching element. The second pixel electrode surrounds the first pixel electrode.

DESCRIPTION OF THE EMBODIMENTS

Figure 1A:
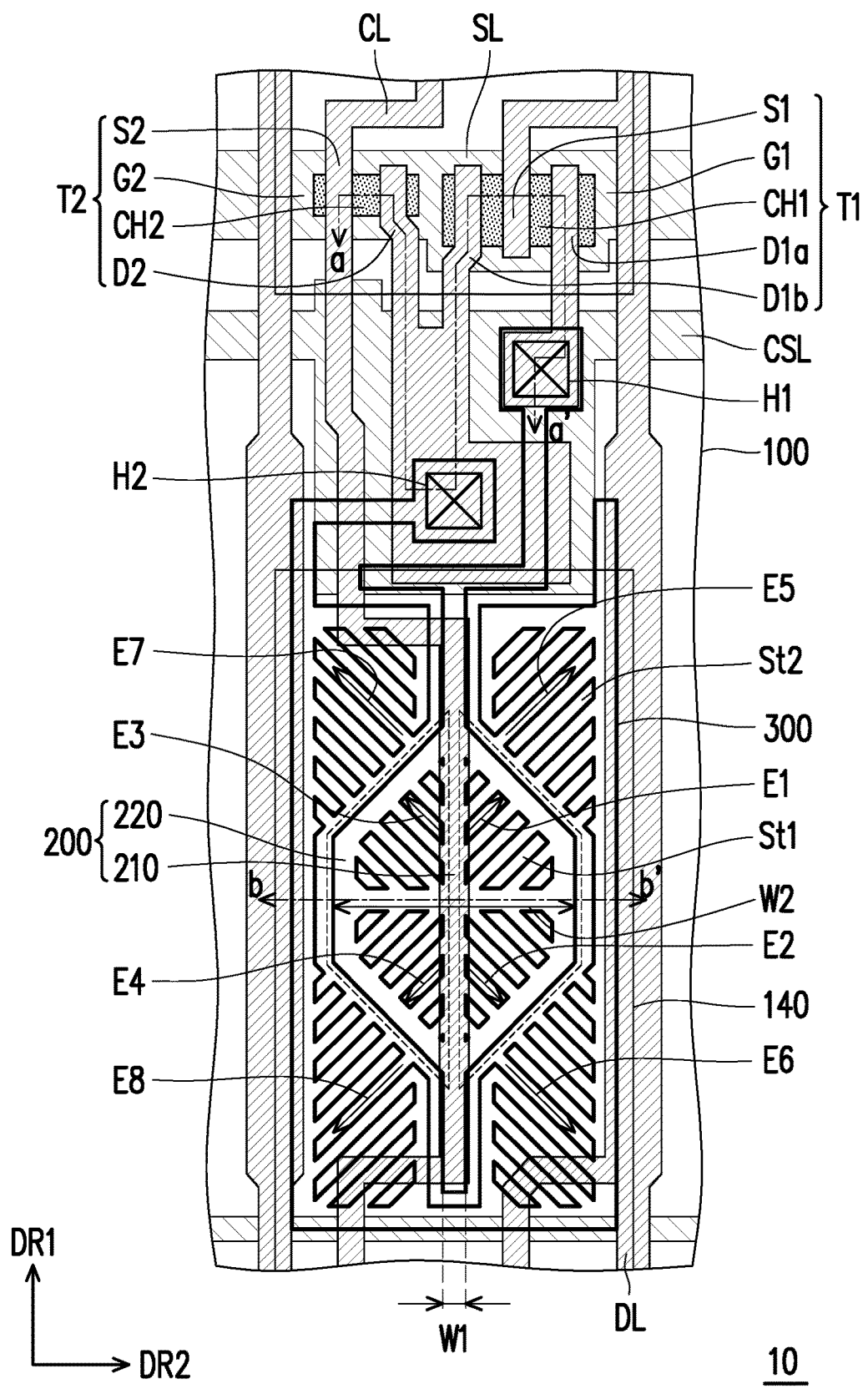
FIG. 1A is a schematic top view of a pixel structure according to an embodiment of the invention.

Embodiments of the invention are disclosed below with reference to the drawings. For clarity, many practical details are described in the following description. However, it should be understood that, such practical details are not intended to limit the invention. That is, in some implementations of the invention, such practical details are unnecessary. In addition, to simplify the drawings, some conventional structures and elements are omitted or simply illustrated in the drawings.

Throughout the specification, same reference numerals indicate same or similar elements. In the accompanying drawings, the thicknesses of layers, films, panels, regions, and the like are enlarged for clarity. It should be understood that when an element such as a layer, film, region or substrate is referred to as being "on" or "connected to" another element, it may be directly on or connected to the another element, or intervening elements may also be present. In contrast, when an element is referred to as being "directly on" or "directly connected to" another element, there are no intervening elements present. As used herein, "connection" may refer to a physical and/or electrical connection. Furthermore, two elements being "electrically connected" or "coupled" to each other means that there is another element between the two elements.

It should be understood that although terms such as "first" and "second" in this specification may be used for describing various elements, components, areas, layers, and/or parts, the elements, components, areas, layers, and/or parts are not limited by such terms. The terms are only used to distinguish one element, component, area, layer, or part from another element, component, area, layer, or part.

In addition, spatially relative terms such as "below", "bottom", "on" or "top" are used in this specification to describe a relationship between one element and another element, as shown in the figures. It should be understood that such spatially relative terms are intended to encompass different orientations of the device in addition to the orientation depicted in the figures. For example, if the device in the figures is turned over, an element described as being "below" relative to another element will then be "above" relative to the another element. Therefore, the exemplary term "below" encompasses both the below and above orientations depending on the spatial orientation of the device. Similarly, if the device in the figures is turned over, an element described as being "below" or "lower" relative to another element will then be "above" or "upper" relative to the another element. Therefore, the exemplary term "below" or "lower" encompasses both the above and below orientations.

Figure 1B:
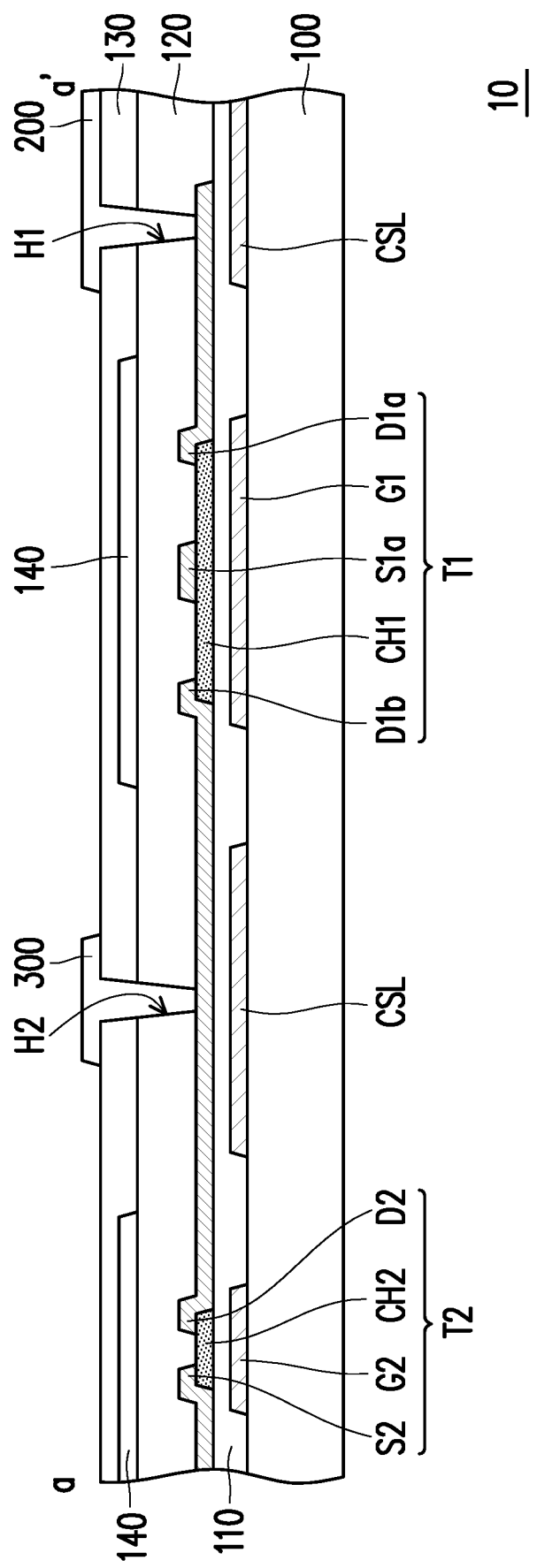
FIG. 1B is a schematic cross-sectional view of FIG. 1A along a line aa'.
Figure 1C:
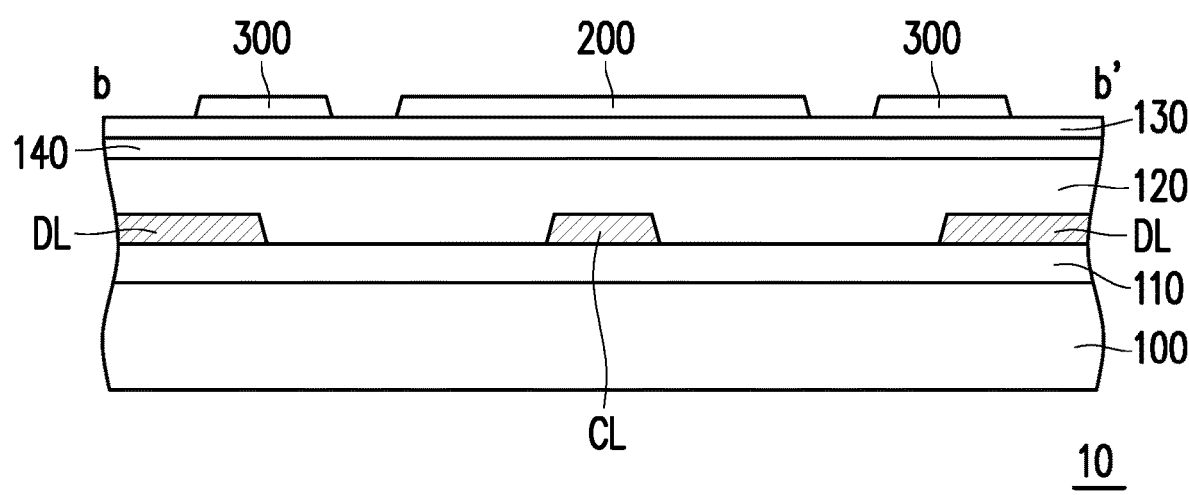
FIG. 1C is a schematic cross-sectional view of FIG. 1A along a line bb'.

FIG. 1A is a schematic top view of a pixel structure according to an embodiment of the invention. FIG. 1B is a schematic cross-sectional view of FIG. 1A along a line aa'. FIG. 1C is a schematic cross-sectional view of FIG. 1A along a line bb'.

Referring to FIG. 1A, FIG. 1B, and FIG. 1C, a pixel structure 10 includes a data line DL, a scan line SL, a common signal line CL, a first switching element T1, a second switching element T2, a first pixel electrode 200, and a second pixel electrode 300.

Referring to FIG. 1A and FIG. 1B, the first switching element T1 and the second switching element T2 are located on a substrate 100. The first switching element T1 is electrically connected to the scan line SL and the data line DL. The second switching element T2 is electrically connected to the scan line SL and the common signal line CL.

In the present embodiment, the first switching element T1 includes a channel layer CH1, a gate G1, a source S1, a first drain D1a, and a second drain D1b. The gate G1 is located on the substrate 100 and is electrically connected to the scan line SL. The gate insulating layer 110 covers the gate G1 and the substrate 100. The channel layer CH1 is located on the gate insulating layer 110 and overlaps the gate G1. The source S1, the first drain D1a, and the second drain D1b are located on and electrically connected to the channel layer CH1. The source S1 is electrically connected to the data line DL. The source S1 is located between the first drain D1a and the second drain D1b.

In the present embodiment, the second switching element T2 includes a channel layer CH2, a gate G2, a source S2, and a drain D2. The gate G2 is located on the substrate 100 and is electrically connected to the scan line SL. The gate insulating layer 110 covers the gate G2. The channel layer CH2 is located on the gate insulating layer 110 and overlaps the gate G2. The source S2 and the drain D2 are located on and electrically connected to the channel layer CH2. The source S2 is electrically connected to the common signal line CL.

In the present embodiment, the pixel structure 10 further includes a capacitor electrode line CSL. The drain D2 of the second switching element T2 is integrated with the second drain D1b of the first switching element T1, and the drain D2 of the second switching element T2, the second drain D1b of the first switching element T1, and the first drain D1a of the first switching element T1 overlap the capacitor electrode line CSL.

In the present embodiment, the gate G1, the gate G2, the scan line SL, and the capacitor electrode line CSL belong to the same film layer and are integrated, but the invention is not limited thereto. In the present embodiment, the source S1, the first drain D1a, the second drain D1b, the source S2, the drain D2, the common signal line CL, and the data line DL belong to the same film layer, but the invention is not limited thereto. In the present embodiment, the gate G1, the gate G2, the scan line SL, the capacitor electrode line CSL, the source S1, the first drain D1a, the second drain D1b, the source S2, the drain D2, the common signal line CL, and the data line DL include, for example, a single conductive material or a plurality of conductive materials, such as metal materials, nitrides of metal materials, oxides of metal materials, oxynitrides of metal materials, or other suitable materials or a tacked layer of metal materials and other conductive materials. In some embodiments, the pixel structure 10 selectively includes a shielding electrode (not shown) overlapping the data line DL. For example, the shielding electrode and the scan line SL belong to the same layer, and the shielding electrode may be configured to reduce interference of a voltage on the data line DL to the pixel electrode.

Although the first switching element T1 and the second switching element T2 are bottom gate thin film transistors in the present embodiment, for example, the invention is not limited thereto. In other embodiments, the first switching element T1 and the second switching element T2 may also be top gate thin film transistors or other types of thin film transistors.

An insulating layer 120 is located on the source S1, the first drain D1a, the second drain D1b, the source S2, the drain D2, the common signal line CL, and the data line DL. In the present embodiment, a color filter element 140 is located on the insulating layer 120, but the invention is not limited thereto. In other embodiments, the color filter element 140 is located between the insulating layer 120 and the gate insulating layer 110. In the present embodiment, the color filter element 140 is located on the substrate 100, and constitutes a structure of a color filter on array (COA), but the invention is not limited thereto. In other embodiments, the color filter element 140 is located on a counter substrate (not shown). A liquid crystal molecule is located between the substrate 100 and the counter substrate.

An insulating layer 130 is located on the color filter element 140. The first pixel electrode 200 and the second pixel electrode 300 are located on the insulating layer 130. The first pixel electrode 200 and the second pixel electrode 300 overlap the color filter element 140. In the present embodiment, the first pixel electrode 200 and the second pixel electrode 300 belong to the same conductive layer and are structurally separated from each other. In the present embodiment, the first pixel electrode 200 and the second pixel electrode 300 include transparent conductive materials, for example, indium tin oxide, indium zinc oxide, aluminum tin oxide, aluminum zinc oxide, indium germanium zinc oxide, or other suitable oxides or a stacked layer of at least two of the above.

In the present embodiment, the first pixel electrode 200 is electrically connected to the first switching element T1. For example, the first pixel electrode 200 fills an aperture H1 and is electrically connected to the first drain D1a of the first switching element T1. The aperture H1 penetrates the insulating layer 120 and the insulating layer 130, for example.

The second pixel electrode 300 is electrically connected to the second switching element T2. For example, the second pixel electrode 300 fills an aperture H2 and is electrically connected to the drain D2 of the second switching element T2. The aperture H2 penetrates the insulating layer 120 and the insulating layer 130, for example.

In the present embodiment, both the first pixel electrode 200 and the second pixel electrode 300 are located on the corresponding same side of the scan line SL. Therefore, as long as the capacitor electrode line CSL is provided on one side of the scan line SL, a storage capacitor corresponding to the first pixel electrode 200 and a second pixel electrode 300 can be formed through the same capacitor electrode line CSL. In this way, an aperture ratio of the pixel structure 10 can be improved.

In the present embodiment, the first pixel electrode 200 includes a trunk portion 210 and two branch portions 220 located on two sides of the trunk portion 210 respectively. A width W2 of the first pixel electrode 200 at the two branch portions 220 is greater than a width W1 of the first pixel electrode 200 away from the branch portions 220. In some embodiments, the first pixel electrode 200 in an aperture area of the pixel structure 10 may be a symmetrical or asymmetrical pattern, but the invention is not limited thereto.

A width of the branch portion 220 gradually decreases with a distance away from the trunk portion 210. For example, a shape of the branch portion 220 is a trapezoid. The wider bottom edge of the branch portion 220 is connected to the trunk portion 210, and the narrower top edge of the branch portion 220 is away from the trunk portion 210. The branch portion 220 has a plurality of radial first slits St1. There is an acute angle between a direction E1 in which the first slits St1 extend and a direction DR1 in which the data line DL extends and between the direction in which the first slits St1 extend and a direction DR2 in which the scan line SL extends. In the present embodiment, the branch portion 220 includes first slits St1 extending in different directions. For example, the branch portion 220 includes a first slit St1 extending in the extending direction E1, a first slit St1 extending in an extending direction E2, a first slit St1 extending in an extending direction E3, and a first slit St1 extending in an extending direction E4. In some embodiments, the extending direction E1 is substantially parallel to the extending direction E4, and the extending direction E2 is substantially parallel to the extending direction E3, but the invention is not limited thereto. There is an acute angle between each of the extending directions E1, E2, E3, and E4 and the extending direction DR1. In some embodiments, the acute angle between each of the extending directions E1, E2, E3, and E4 and the extending direction DR1 is between 30 degrees and 60 degrees. The extending direction DR1 and the extending direction DR2 are substantially perpendicular to each other.

In the present embodiment, the common signal line CL overlaps the trunk portion 210 of the first pixel electrode 200. For example, the common signal line CL in the aperture area of the pixel structure 10 overlaps the trunk portion 210, thereby reducing impact of the common signal line CL on a penetrance of the pixel structure 10.

The second pixel electrode 300 surrounds the first pixel electrode 200. In the present embodiment, a shortest distance between the first pixel electrode 200 and the second pixel electrode 300 is between 2 microns and 5 microns. In some embodiments, the second pixel electrode 300 in the aperture area of the pixel structure 10 may be a symmetrical or asymmetrical pattern, but the invention is not limited thereto.

The second pixel electrode 300 has a plurality of radial second slits St2. There is an acute angle between a direction in which the second slits St2 extend and the direction DR1 in which the data line DL extends and between the direction in which the second slits St2 extend and the direction DR2 in which the scan line SL extends. In the present embodiment, the second pixel electrode 300 includes second slits St2 extending in different directions. For example, the second pixel electrode 300 includes a second slit St2 extending in an extending direction E5, a second slit St2 extending in an extending direction E6, a second slit St2 extending in an extending direction E7, and a second slit St2 extending in an extending direction E8. In some embodiments, the extending direction E5 is substantially parallel to the extending direction E8, and the extending direction E6 is substantially parallel to the extending direction E7, but the invention is not limited thereto. There is an acute angle between each of the extending directions E5, E6, E7, and E8 and the extending direction DR1. In some embodiments, the acute angle between each of the extending directions E5, E6, E7, and E8 and the extending direction DR1 is between 30 degrees and 60 degrees.

In the present embodiment, the first slit St1 of the branch portion 220 is not opened toward the second pixel electrode 300. For example, the first slit St1 of the branch portion 220 is not exposed from a sidewall of the branch portion 220 facing the second pixel electrode 300.

In the present embodiment, at least some of the second slits St2 are opened toward the two branch portions 220. For example, a second slit St2 adjacent to the sidewall of the branch portion 220 is opened toward the two branch portions 220. In other words, some of the second slits St2 of the second pixel electrode 300 toward the branch portion 220 penetrate a sidewall of the second pixel electrode 300 close to the branch portion 220. In this way, poor liquid crystal guidance can be relieved.

In some embodiments, the first pixel electrode 200 and the second pixel electrode 300 have a voltage difference. For example, a ratio of a voltage on the second pixel electrode 300 to a voltage on the first pixel electrode 200 is between 1:4 and 8:9. Since the first pixel electrode 200 and the second pixel electrode 300 have a voltage difference, liquid crystal efficiency at a junction of the first pixel electrode 200 and the second pixel electrode 300 can be improved, and a width of the trunk portion 210 of the first pixel electrode 200 can be reduced.

Based on the above, the second pixel electrode 300 surrounds the first pixel electrode 200, so that the pixel structure 10 can be divided into a plurality of domains, and the pixel structure 10 has a high aperture ratio.

Figure 2:
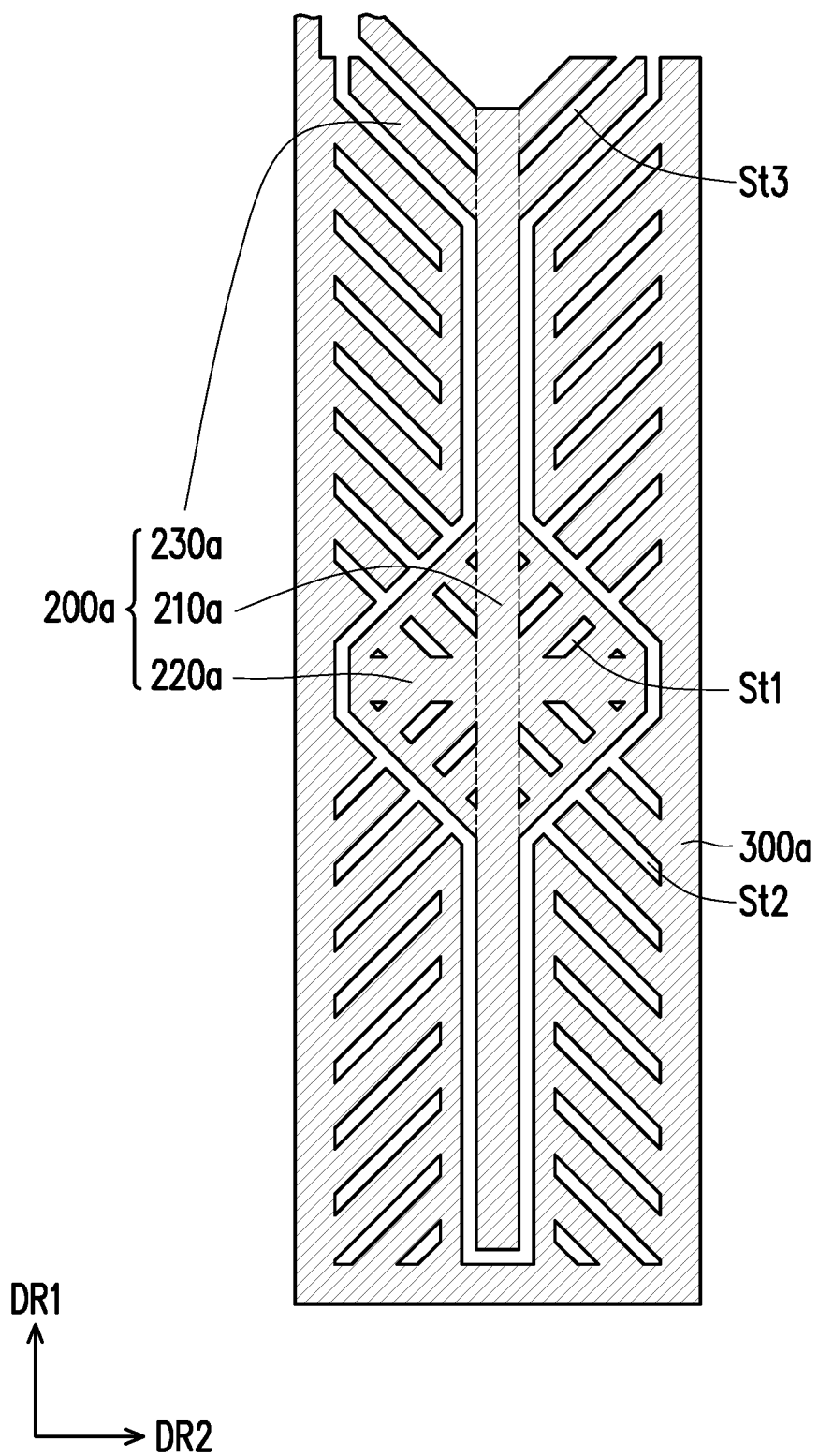
FIG. 2 is a schematic top view of a first pixel electrode and a second pixel electrode according to an embodiment of the invention.

FIG. 2 is a schematic top view of a first pixel electrode and a second pixel electrode according to an embodiment of the invention. It needs to be noted herein that element numerals and some content in the embodiment of FIG. 2 are the same as those in the embodiments in FIG. 1A to FIG. 1C, and same or similar numerals are used to represent same or similar elements, and descriptions about same technical content are omitted. For the descriptions of the omitted part, reference may be made to the above embodiments, and the descriptions thereof are omitted herein.

In the present embodiment, the first pixel electrode 200a includes a trunk portion 210a and branch portions 220a located on two sides of the trunk portion 210a. The branch portion 220a in FIG. 2 has a smaller area than the branch portion 220 in FIG. 1A.

In the present embodiment, the first pixel electrode 200a further includes a plurality of extending portions 230a located on two sides of the trunk portion 210a. The extending portion 230a is located on a side of the trunk portion 210a close to the first switching element (not shown in FIG. 2), and the first switching element is connected to the trunk portion 210a or the extending portion 230a. In the present embodiment, there is a third slit St3 between two adjacent extending portions 230a.

Based on the above, the second pixel electrode 300a surrounds the first pixel electrode 200a, so that the pixel structure can be divided into a plurality of domains, and the pixel structure has a high aperture ratio.

Figure 3:
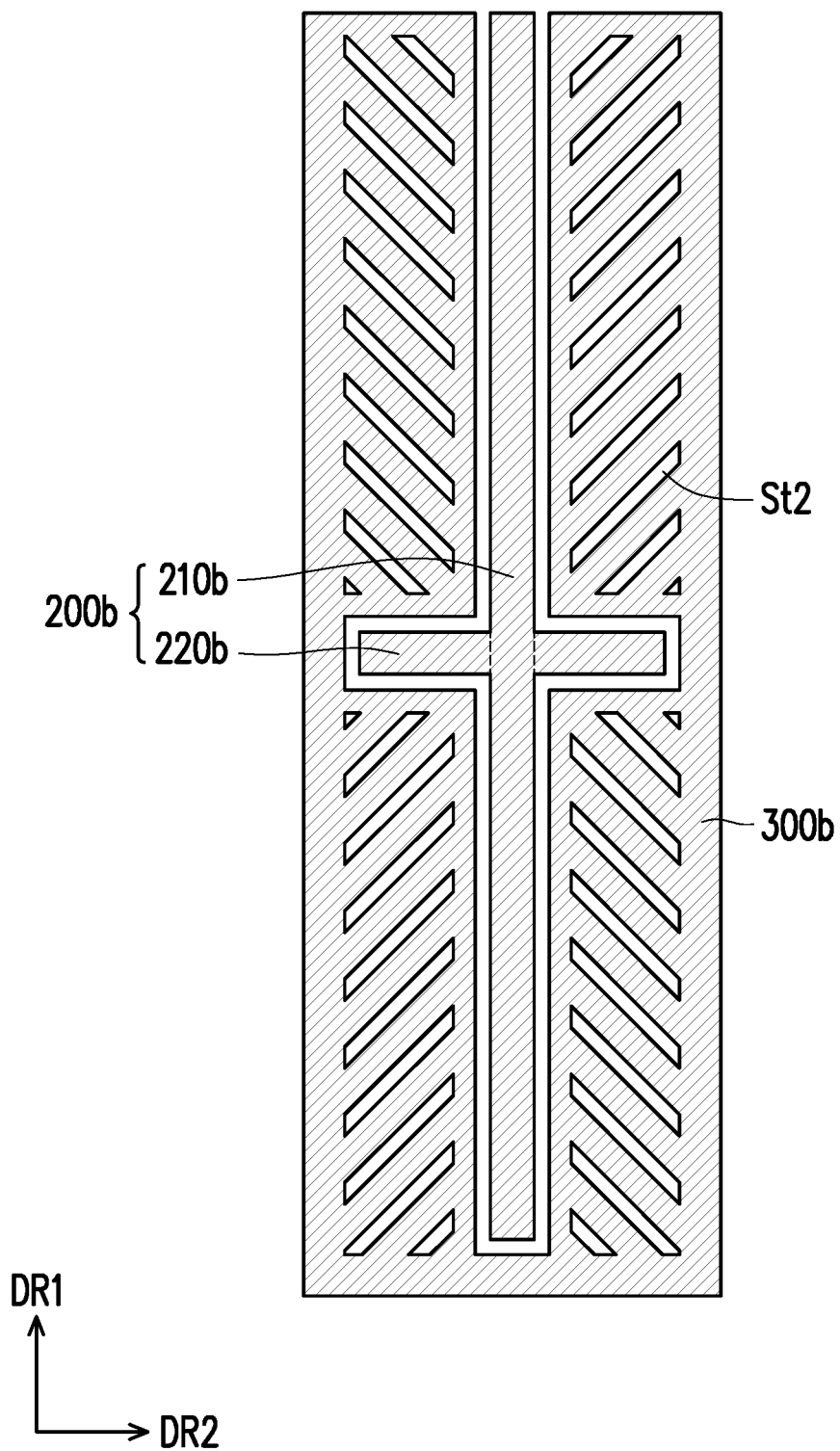
FIG. 3 is a schematic top view of a first pixel electrode and a second pixel electrode according to an embodiment of the invention.

FIG. 3 is a schematic top view of a first pixel electrode and a second pixel electrode according to an embodiment of the invention. It needs to be noted herein that element numerals and some content in the embodiment of FIG. 3 are the same as those in the embodiment in FIG. 2, and same or similar numerals are used to represent same or similar elements, and descriptions about same technical content are omitted. For the descriptions of the omitted part, reference may be made to the above embodiments, and the descriptions thereof are omitted herein.

Referring to FIG. 3, in the present embodiment, a first pixel electrode 200b includes a trunk portion 210b and branch portions 220b located on two sides of the trunk portion 210b. In the present embodiment, the branch portion 220b is linear, and the first pixel electrode 200b is substantially cross-shaped.

Based on the above, the second pixel electrode 300b surrounds the first pixel electrode 200b, so that the pixel structure can be divided into a plurality of domains, and the pixel structure has a high aperture ratio.

Figure 4:
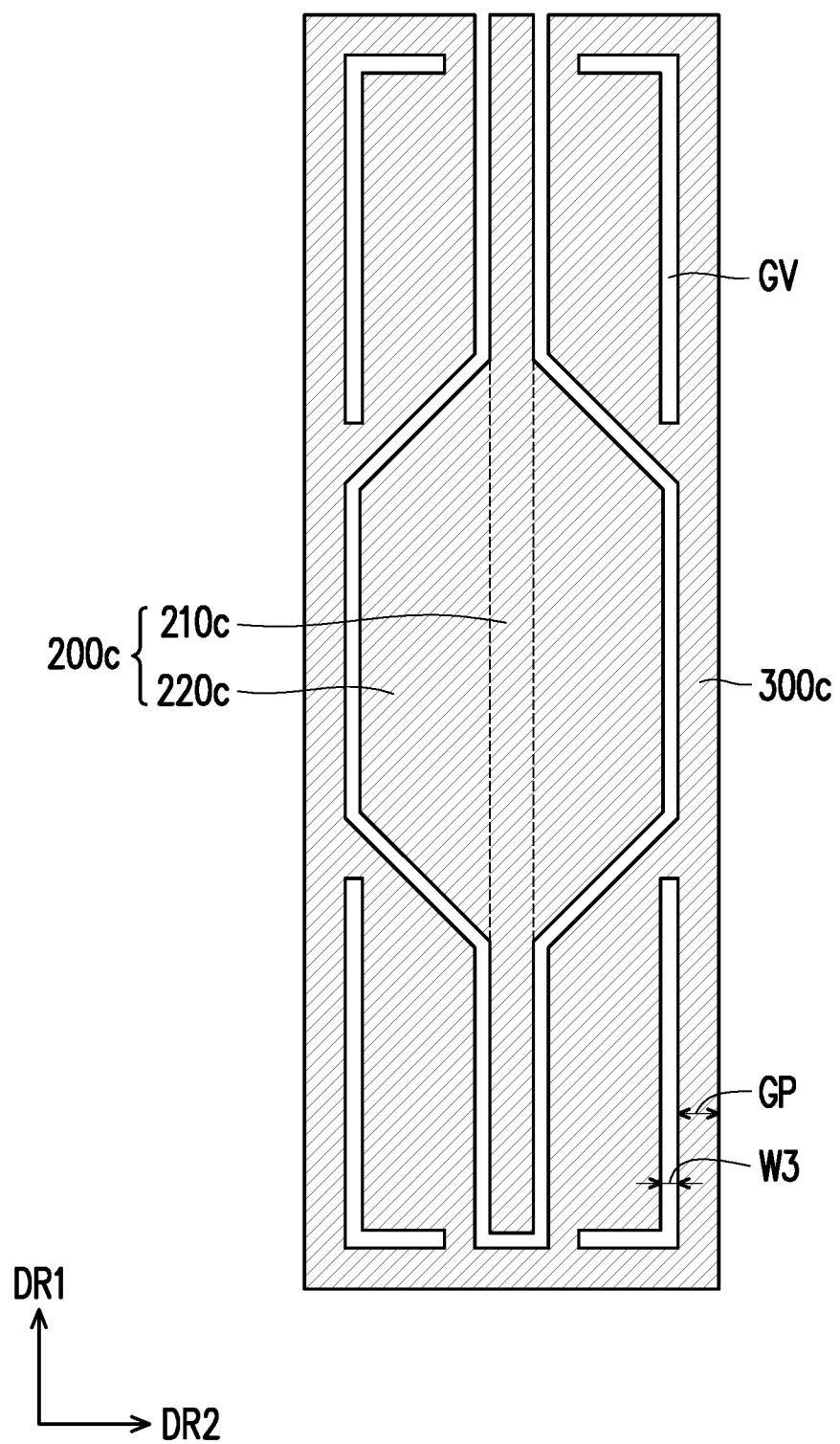
FIG. 4 is a schematic top view of a first pixel electrode and a second pixel electrode according to an embodiment of the invention.

FIG. 4 is a schematic top view of a first pixel electrode and a second pixel electrode according to an embodiment of the invention. It needs to be noted herein that element numerals and some content in the embodiment of FIG. 4 are the same as those in the embodiments in FIG. 1A to FIG. 1C, and same or similar numerals are used to represent same or similar elements, and descriptions about same technical content are omitted. For the descriptions of the omitted part, reference may be made to the above embodiments, and the descriptions thereof are omitted herein.

Referring to FIG. 4, in the present embodiment, there is no first slit in a first pixel electrode 200c, and there is no second slit in a second pixel electrode 300c.

In the present embodiment, a shortest distance between the first pixel electrode 200c and the second pixel electrode 300c is between 2 microns and 5 microns.

In the present embodiment, the second pixel electrode 300c has a groove GV. In the present embodiment, the second pixel electrode 300c has four grooves GV separated from each other. Each of the grooves GV corresponds to a corner of the second pixel electrode 300c, but the invention is not limited thereto. In other embodiments, the grooves GV may communicate with each other, and a number of grooves GV may be adjusted according to requirements.

A direction in which the groove GV extends is substantially parallel to the direction DR1 in which the data line (not shown in FIG. 4) extends and/or the direction DR2 in which the scan line (not shown in FIG. 4) extends. In the present embodiment, a direction in which some of the grooves GV extend is substantially parallel to the direction DR1 in which the data line extends, and a direction in which some of the grooves GV extend is substantially parallel to the direction DR2 in which the scan line extends.

In the present embodiment, a width W3 of the groove GV is between 2 microns and 5 microns. In the present embodiment, the groove GV is adjacent to an edge of the second pixel electrode 300c. For example, a gap GP between the groove GV and the edge of the second pixel electrode 300c is between 2 microns and 5 microns. With the disposed groove GV, a rotation direction of a liquid crystal near a boundary of the pixel structure can be improved, and the penetrance of the pixel structure can be increased.

In the present embodiment, the first pixel electrode 200c and the second pixel electrode 300c have a voltage difference. For example, a ratio of a voltage on the second pixel electrode 300c to a voltage on the first pixel electrode 200c is between 1:4 and 8:9.

In some embodiments, by adjusting a ratio of an area of the first pixel electrode 200c to an area of the second pixel electrode 300c, the pixel structure can have a wide viewing angle.

Based on the above, the second pixel electrode 300c surrounds the first pixel electrode 200c, so that the pixel structure can be divided into a plurality of domains, and the pixel structure has a high aperture ratio.

Figure 5:
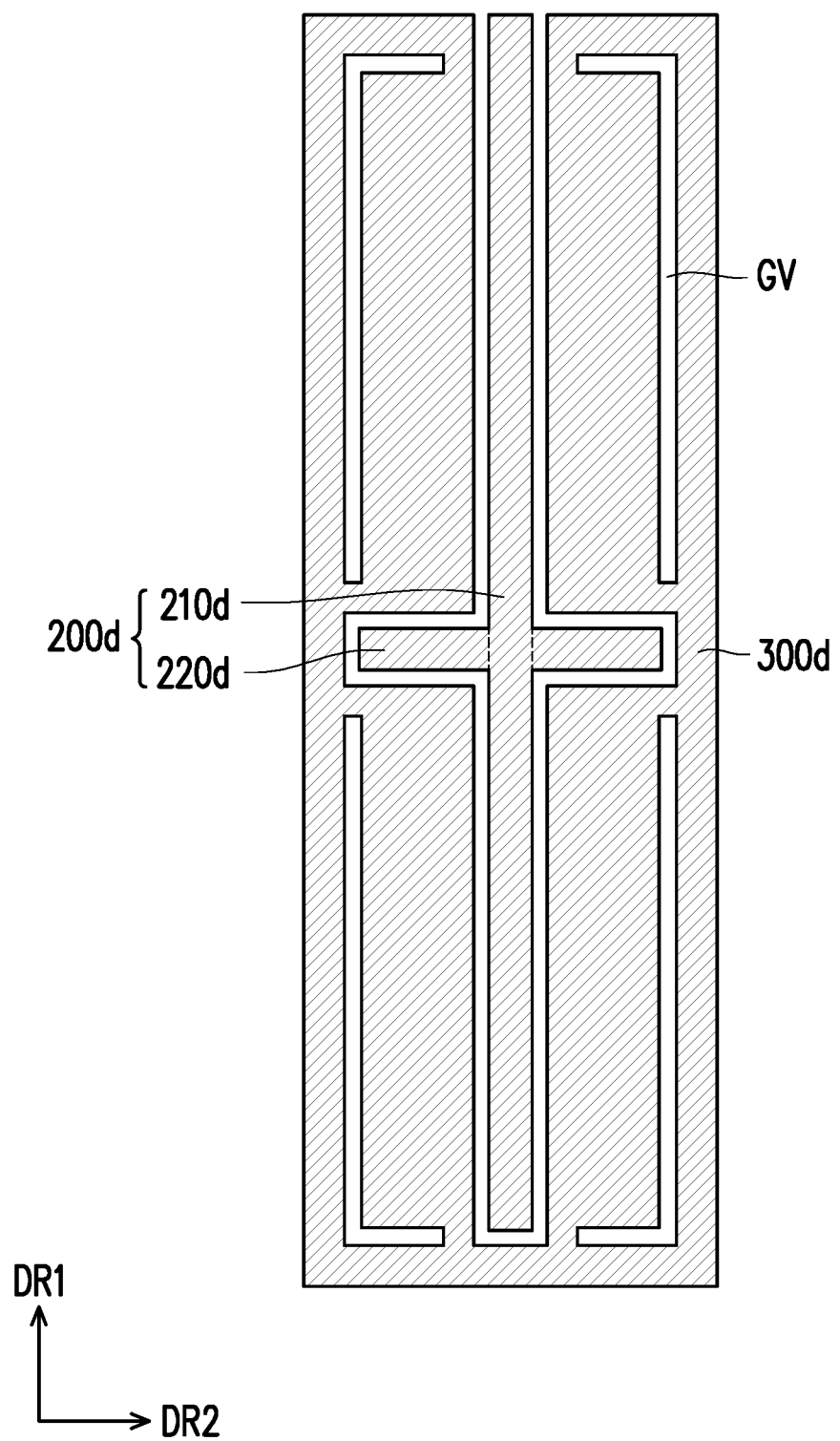
FIG. 5 is a schematic top view of a first pixel electrode and a second pixel electrode according to an embodiment of the invention.

FIG. 5 is a schematic top view of a first pixel electrode and a second pixel electrode according to an embodiment of the invention. It needs to be noted herein that element numerals and some content in the embodiment of FIG. 5 are the same as those in the embodiment in FIG. 4, and same or similar numerals are used to represent same or similar elements, and descriptions about same technical content are omitted. For the descriptions of the omitted part, reference may be made to the above embodiments, and the descriptions thereof are omitted herein.

Referring to FIG. 5, in the present embodiment, a first pixel electrode 200d includes a trunk portion 210d and branch portions 220d located on two sides of the trunk portion 210d. In the present embodiment, the branch portion 220d is linear, and the first pixel electrode 200d is substantially cross-shaped.

Based on the above, a second pixel electrode 300d surrounds a first pixel electrode 200d, so that the pixel structure can be divided into a plurality of domains, and the pixel structure has a high aperture ratio.

Figure 6:
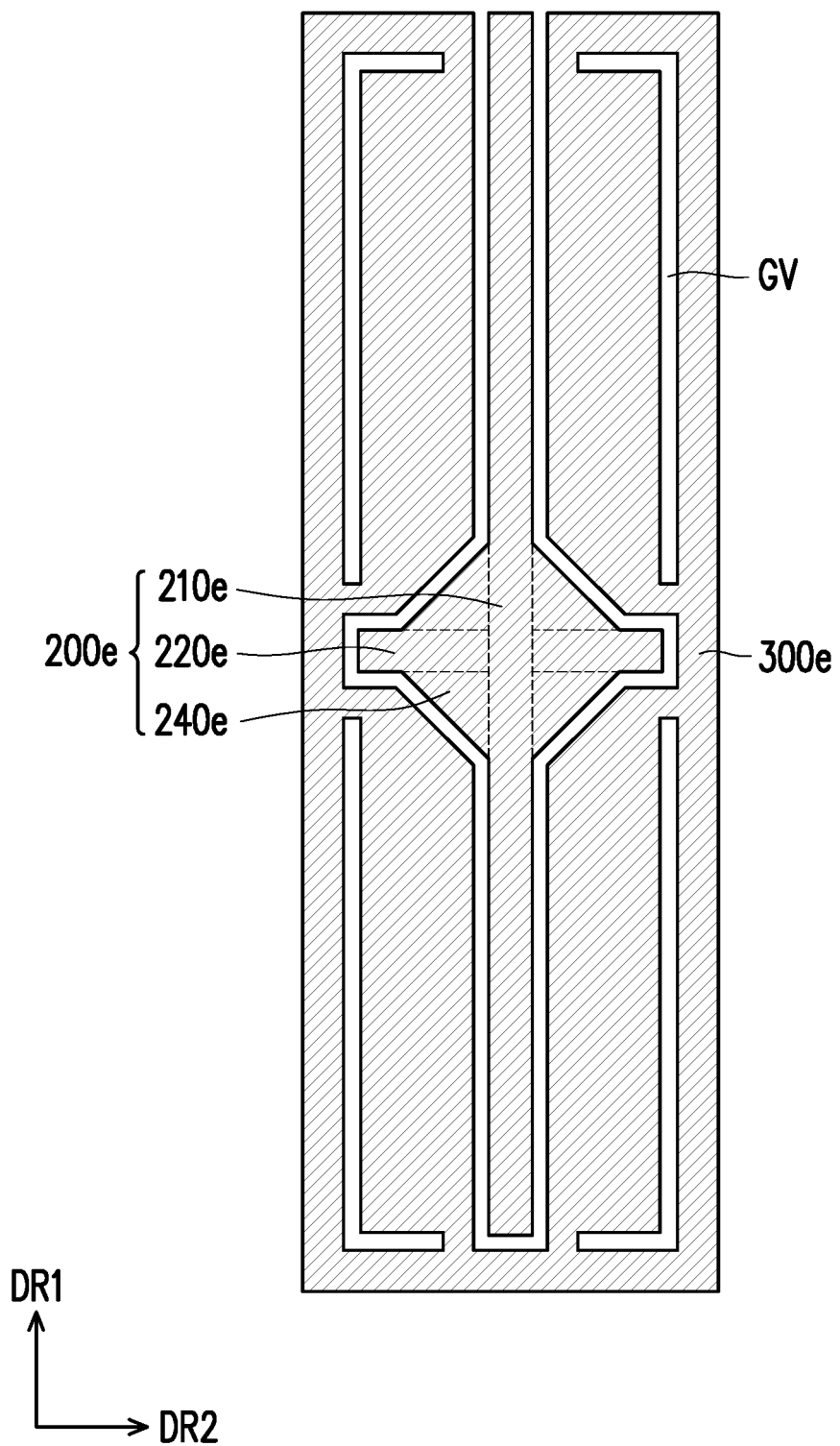
FIG. 6 is a schematic top view of a first pixel electrode and a second pixel electrode according to an embodiment of the invention.

FIG. 6 is a schematic top view of a first pixel electrode and a second pixel electrode according to an embodiment of the invention. It needs to be noted herein that element numerals and some content in the embodiment of FIG. 6 are the same as those in the embodiment in FIG. 5, and same or similar numerals are used to represent same or similar elements, and descriptions about same technical content are omitted. For the descriptions of the omitted part, reference may be made to the above embodiments, and the descriptions thereof are omitted herein.

Referring to FIG. 6, in the present embodiment, a first pixel electrode 200e includes a trunk portion 210e, a branch portion 220e, and a plurality of connecting portions 240e. In the present embodiment, the branch portion 220e is linear, and the connecting portion 240e is triangular. The connecting portion 240e is located at an included angle between the trunk portion 210e and the branch portion 220e.

Based on the above, a second pixel electrode 300e surrounds the first pixel electrode 200e, so that the pixel structure can be divided into a plurality of domains, and the pixel structure has a high aperture ratio.

Figure 7:
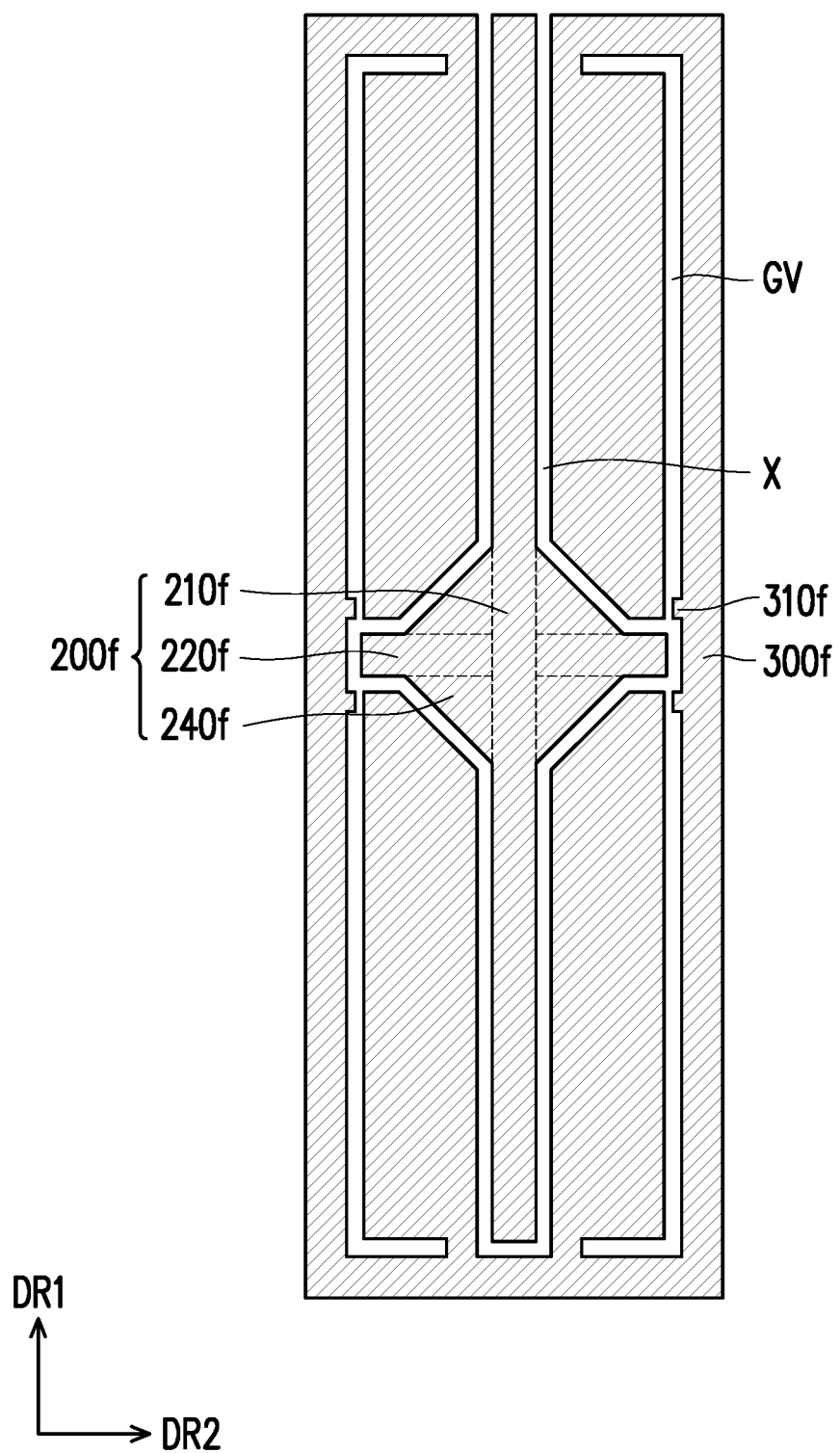
FIG. 7 is a schematic top view of a first pixel electrode and a second pixel electrode according to an embodiment of the invention.

FIG. 7 is a schematic top view of a first pixel electrode and a second pixel electrode according to an embodiment of the invention. It needs to be noted herein that element numerals and some content in the embodiment of FIG. 7 are the same as those in the embodiment in FIG. 6, and same or similar numerals are used to represent same or similar elements, and descriptions about same technical content are omitted. For the descriptions of the omitted part, reference may be made to the above embodiments, and the descriptions thereof are omitted herein.

Referring to FIG. 7, in the present embodiment, a first pixel electrode 200f includes a trunk portion 210f, a branch portion 220f, and a plurality of connecting portions 240f. The second pixel electrode 300f has two grooves GV. The two grooves GV are respectively located on two sides of the first pixel electrode 200f.

The second pixel electrode 300f includes a protrusion structure 310f located in the groove GV. The protrusion structure 310f is adjacent to a corresponding branch portion 220f. In the present embodiment, a gap X between the first pixel electrode 200e and the second pixel electrode 300e is connected to the groove GV, the protrusion structure 310f is located at a side surface of the groove GV facing the branch portion 220f, and the protrusion structure 310f is located at a joint between the gap X and the groove GV.

Based on the above, a second pixel electrode 300f surrounds the first pixel electrode 200f, so that the pixel structure can be divided into a plurality of domains, and the pixel structure has a high aperture ratio.

What is claimed is:

1. A pixel structure comprising:
   a substrate;
   a data line, a scan line, and a common signal line formed on the substrate;
   a first switching element electrically connected to the scan line and the data line;
   a second switching element electrically connected to the scan line and the common signal line;
   a first pixel electrode electrically connected to the first switching element; and
   a second pixel electrode electrically connected to the second switching element, wherein the second pixel electrode surrounds the first pixel electrode,
   wherein the common signal line has two turnings, the two turnings are completely overlapped with the second pixel electrode, and an orthogonal projection of a straight portion of the common signal line connecting the two turnings on the substrate is outside an orthogonal projection of the second pixel electrode on the substrate.

2. The pixel structure according to claim 1, wherein the first pixel electrode comprises:
   a trunk portion; and
   two branch portions located on two sides of the trunk portion, respectively.

3. The pixel structure according to claim 2, wherein the two branch portions are linear.

4. The pixel structure according to claim 2, wherein widths of the two branch portions gradually decrease with a distance away from the trunk portion.

5. The pixel structure according to claim 4, wherein there are a plurality of first slits in the two branch portions, and an acute angle exists between a direction in which the first slits extend and a direction in which the data line extends.

6. The pixel structure according to claim 2, wherein there are a plurality of second slits in the second pixel electrode, and an acute angle exists between a direction in which the second slits extend and a direction in which the data line extends.

7. The pixel structure according to claim 6, wherein at least some of the second slits penetrate through a sidewall of the second pixel electrode close to the two branch portions.

8. The pixel structure according to claim 2, wherein the second pixel electrode comprises a groove, and a direction in which the groove extends is substantially parallel to a direction in which the data line extends and/or a direction in which the scan line extends.

9. The pixel structure according to claim 8, wherein the second pixel electrode comprises a protrusion structure located in the groove, and the protrusion structure is adjacent to the corresponding branch portion.

10. The pixel structure according to claim 1, wherein a width of the first pixel electrode at the two branch portions is greater than a width of the first pixel electrode away from the two branch portions.

11. The pixel structure according to claim 1, wherein a shortest distance between the first pixel electrode and the second pixel electrode is between 2 microns and 5 microns.

12. The pixel structure according to claim 1, wherein the first pixel electrode and the second pixel electrode belong to a same film layer.

13. The pixel structure according to claim 1, wherein a ratio of a voltage on the second pixel electrode to a voltage on the first pixel electrode is between 1:4 and 8:9.

* * * * *